(12) United States Patent
Kim et al.

(10) Patent No.: US 12,482,718 B2
(45) Date of Patent: Nov. 25, 2025

(54) THERMALLY ENHANCED EMBEDDED DIE PACKAGE

(71) Applicant: Texas Instruments Incorporated, Dallas, TX (US)

(72) Inventors: Woochan Kim, San Jose, CA (US); Kwang-Soo Kim, Sunnyvale, CA (US); Vivek Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 411 days.

(21) Appl. No.: 17/876,621

(22) Filed: Jul. 29, 2022

(65) Prior Publication Data
US 2024/0038619 A1  Feb. 1, 2024

(51) Int. Cl.
H01L 23/367  (2006.01)
H01L 21/48   (2006.01)
(Continued)

(52) U.S. Cl.
CPC ...... *H01L 23/3675* (2013.01); *H01L 21/4882* (2013.01); *H01L 23/3735* (2013.01); *H01L 23/5389* (2013.01); *H01L 24/32* (2013.01); *H01L 24/83* (2013.01); *H01L 24/16* (2013.01); *H01L 24/73* (2013.01); *H01L 2224/16225* (2013.01); *H01L 2224/3201* (2013.01); *H01L 2224/32245* (2013.01); *H01L 2224/73253* (2013.01); *H01L 2224/83203* (2013.01); *H01L 2224/83862* (2013.01); *H01L 2924/1033* (2013.01); *H01L 2924/1711* (2013.01);
(Continued)

(58) Field of Classification Search
CPC ............ H01L 23/3675; H01L 21/4882; H01L 23/3735; H01L 23/5389; H01L 24/32; H01L 24/83; H01L 24/16; H01L 24/73; H01L 2224/16225; H01L 2224/3201; H01L 2224/32245; H01L 2224/73253; H01L 2224/83203; H01L 2224/83862; H01L 2924/1033; H01L 2924/1711; H01L 2924/172; H01L 2924/173; H01L 2924/176; H01L 2924/3512; H01L 2224/83; H01L 2224/83801; H01L 23/13; H01L 23/36

See application file for complete search history.

(56) References Cited

U.S. PATENT DOCUMENTS

2009/0085197 A1* 4/2009 Ajmera ............... H01L 23/427
                                                       257/713
2017/0104138 A1* 4/2017 Shatalov ............ H10H 20/01

OTHER PUBLICATIONS

Sekisui "Heat release sheet Fin P-fin/N-fin, Resin substrate, insulation heat release with copper", 2022.

* cited by examiner

*Primary Examiner* — Patricia D Valenzuela
(74) *Attorney, Agent, or Firm* — Ronald O. Neerings; Frank D. Cimino

(57) ABSTRACT

An electronic device includes an embedded die frame having a cavity and a routing structure, a semiconductor die in the cavity with a gallium nitride layer on the routing structure, and a heat spreader having a thermally conductive insulator layer and a metal plate, the thermally conductive insulator layer having a first side that faces the embedded die frame and an opposite second side that faces away from the embedded die frame, with a portion of the first side of the thermally conductive insulator layer extending over a side of a silicon substrate of the semiconductor die, and the metal plate on the second side of the thermally conductive insulator layer.

16 Claims, 20 Drawing Sheets

(51) Int. Cl.
*H01L 23/00* (2006.01)
*H01L 23/373* (2006.01)
*H01L 23/538* (2006.01)

(52) U.S. Cl.
CPC .. *H01L 2924/172* (2013.01); *H01L 2924/173* (2013.01); *H01L 2924/176* (2013.01); *H01L 2924/3512* (2013.01)

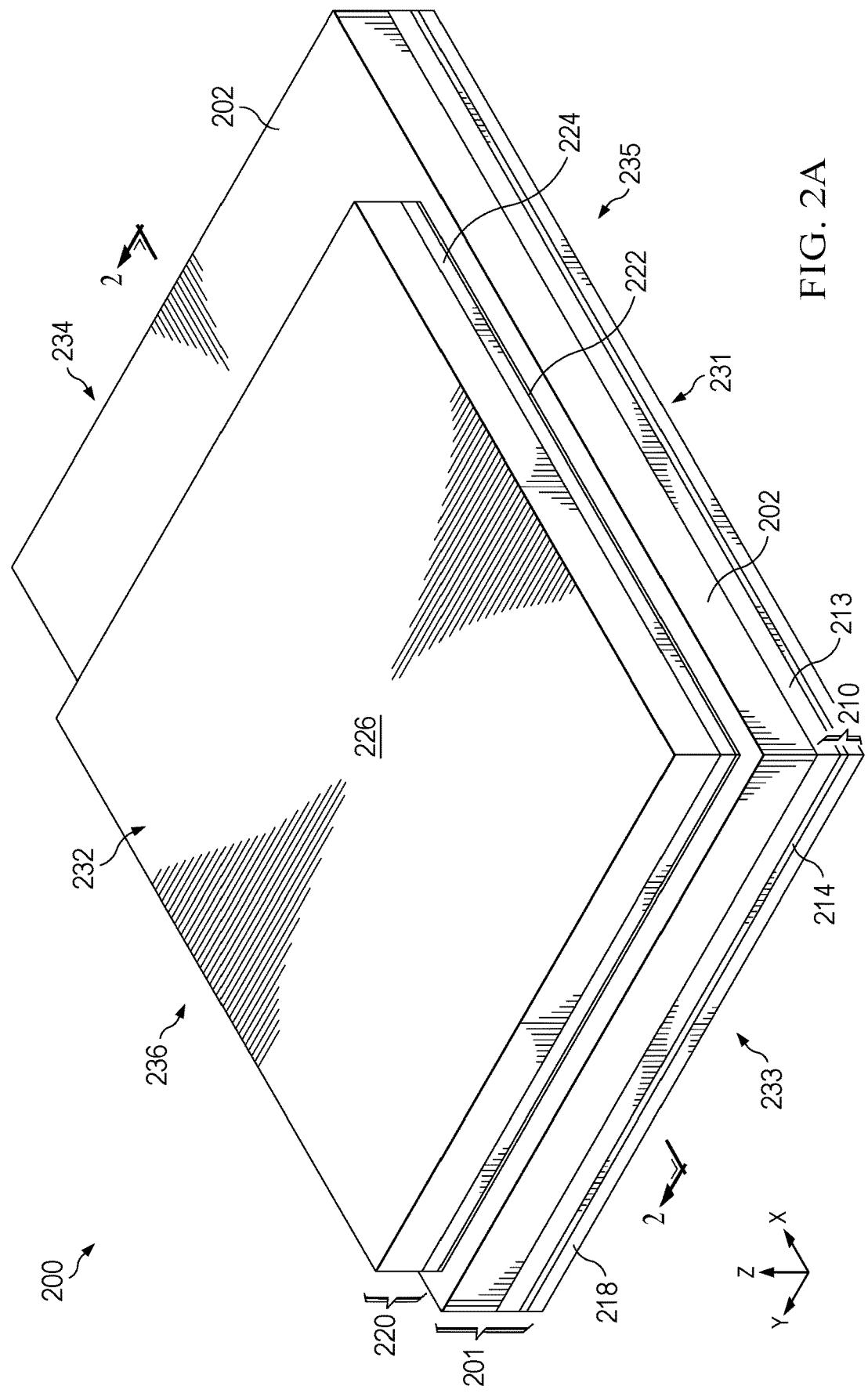

THERMALLY ENHANCED EMBEDDED DIE PACKAGE

BACKGROUND

Embedded die packaged electronic devices include a semiconductor die in a cavity of a printed circuit board (PCB) type organic laminate frame or substrate, along with conductive vias and a routing structure for electrical interconnections, which can facilitate size reduction, power savings, and improved system efficiency. High power devices, such as high voltage gallium nitride transistors can generate heat in operation, so thermal management is important in embedded die packaged devices. Removing heat from an operating transistor becomes more important as gallium nitride transistors and other power circuit components become smaller. Gallium nitride transistor packaging also preferably has minimal parasitic inductance to facilitate high switching frequency operation. Directly connecting a thick metal plate to an embedded die can facilitate heat removal, for example, by exposing a portion of the metal plate outside the package device for heat spreading to the ambient environment and/or attachment of an additional external heatsink to the metal plate. However, coefficient of thermal expansion (CTE) mismatch between the thick metal plate and a silicon substrate of the embedded die can lead to cracking in the embedded die through thermal cycling in manufacturing and/or in operation of the device. Reducing the thickness of the metal plate increases the thermal resistance and reduces the amount of heat removal. Providing copper posts between the embedded die and the metal plate can reduce mechanical stress, but the copper posts reduce the effective thermal contact area, also resulting in thermal resistance increase and reduction in heat removal.

SUMMARY

In one aspect, an electronic device includes a semiconductor die in a cavity of an embedded die frame, a thermally conductive insulator layer having a first side over and thermally coupled to a side of the semiconductor die, and a metal plate on an opposite second side of the thermally conductive insulator layer.

In another aspect, an electronic device includes an embedded die frame, a semiconductor die, and a heat spreader. The embedded die frame has a cavity and a routing structure. The semiconductor die includes a silicon substrate and a gallium nitride layer on the silicon substrate. The semiconductor die is in the cavity and the gallium nitride layer is on the routing structure. The heat spreader has a thermally conductive insulator layer and a metal plate, and the thermally conductive insulator layer has a first side that faces the embedded die frame and an opposite second side that faces away from the embedded die frame. A portion of the first side of the thermally conductive insulator layer extends over a side of the silicon substrate, and the metal plate is on the second side of the thermally conductive insulator layer.

In a further aspect, a method of fabricating an electronic device includes attaching a semiconductor die to a routing structure in a cavity of an embedded die frame, with a side of the semiconductor die facing away from the routing structure, as well as attaching a heat spreader over the side of the semiconductor die, with a first side of a thermally conductive insulator layer of the heat spreader facing the side of the semiconductor die, and with a metal plate of the heat spreader on an opposite second side of the thermally conductive insulator layer.

BRIEF DESCRIPTION OF THE DRAWINGS

FIG. 2A is a top perspective view of the electronic device of FIG. 2.

DETAILED DESCRIPTION

Figure 1:
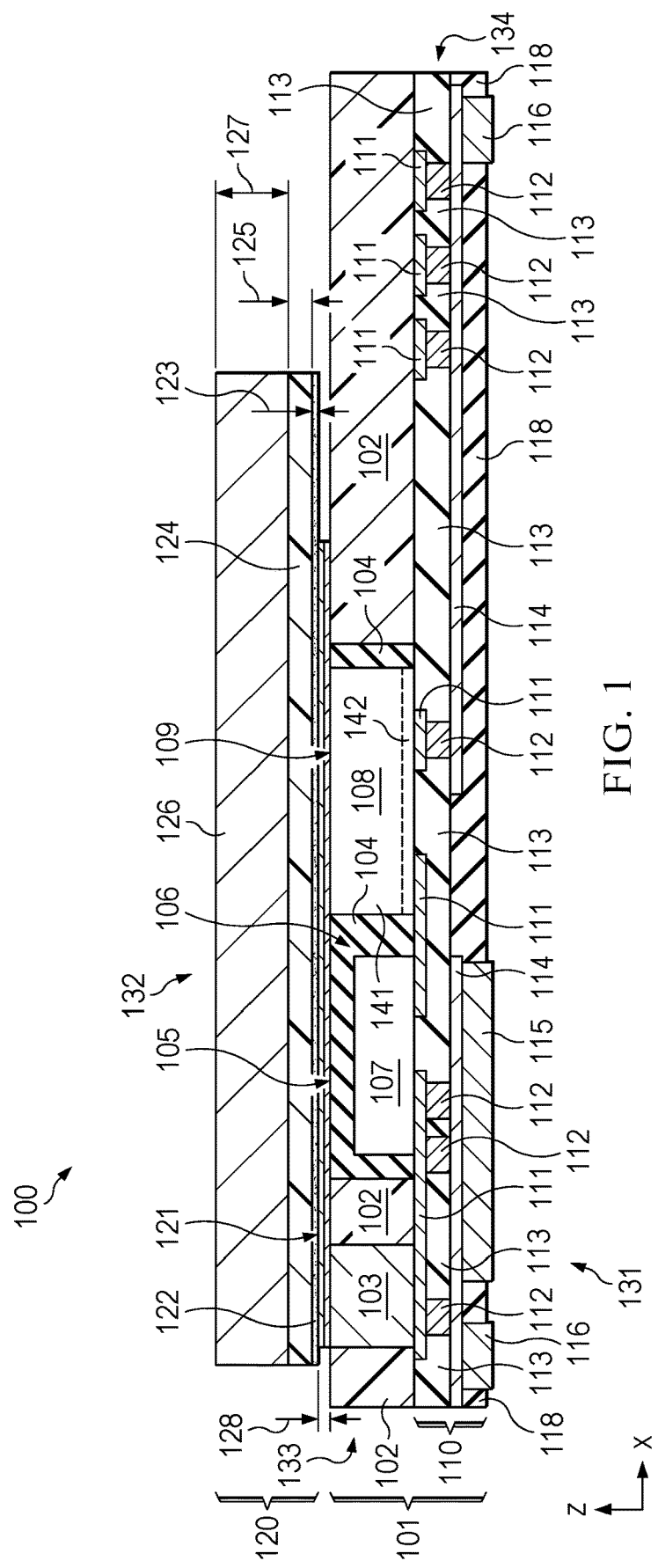
FIG. 1 is a partial sectional side elevation view of an electronic device with an embedded die package, a thin copper layer on a die backside, and a thermally conductive insulating layer on the thin copper layer.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. Unless otherwise stated, "about," "approximately," or "substantially" preceding a value means+/−10 percent of the stated value. One or more operational characteristics of various circuits, systems and/or components are hereinafter described in the context of functions which in some cases result from configuration and/or interconnection of various structures when circuitry is powered and operating.

Figure 1A:
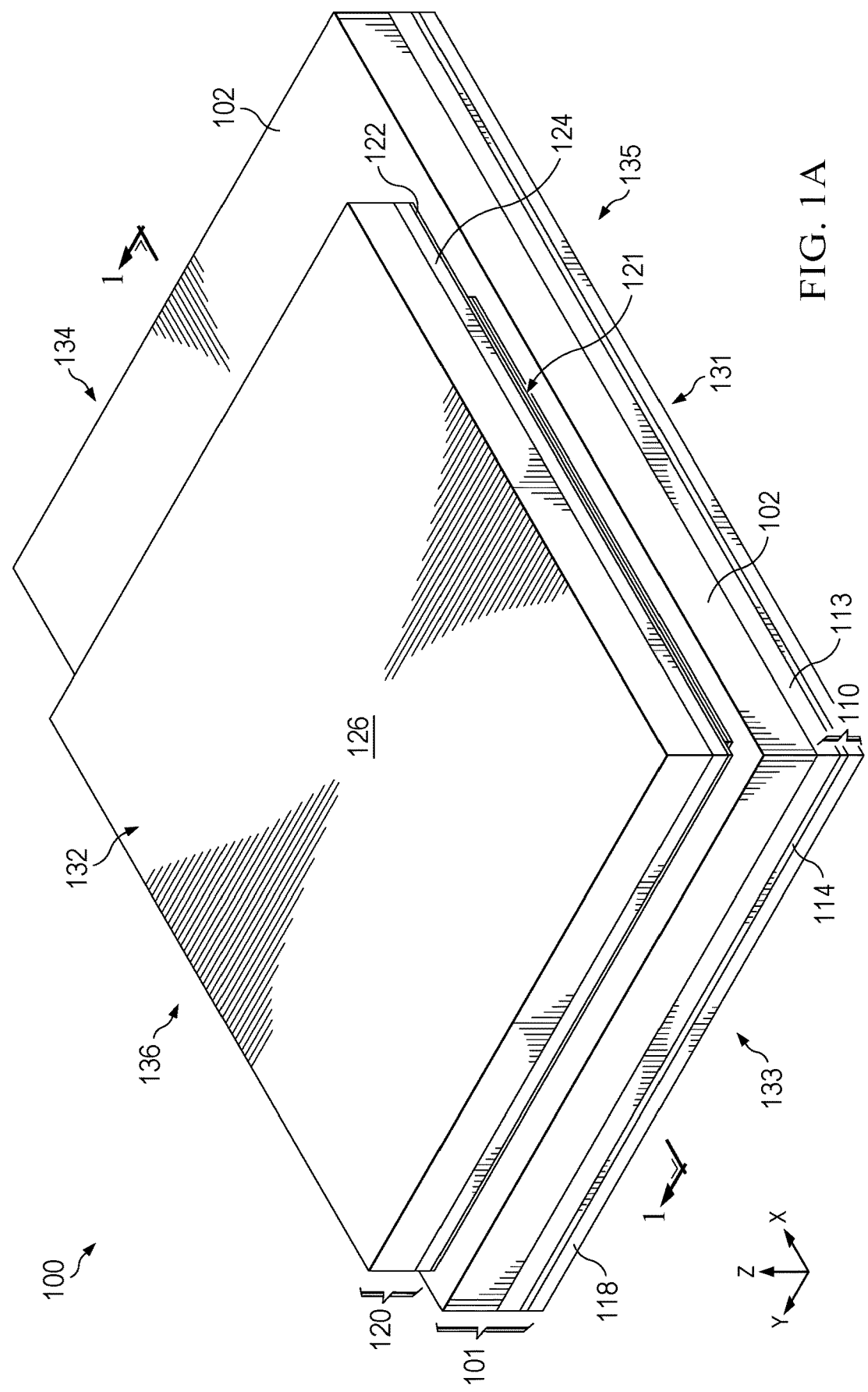
FIG. 1A is a top perspective view of the electronic device of FIG. 1.
Figure 1B:
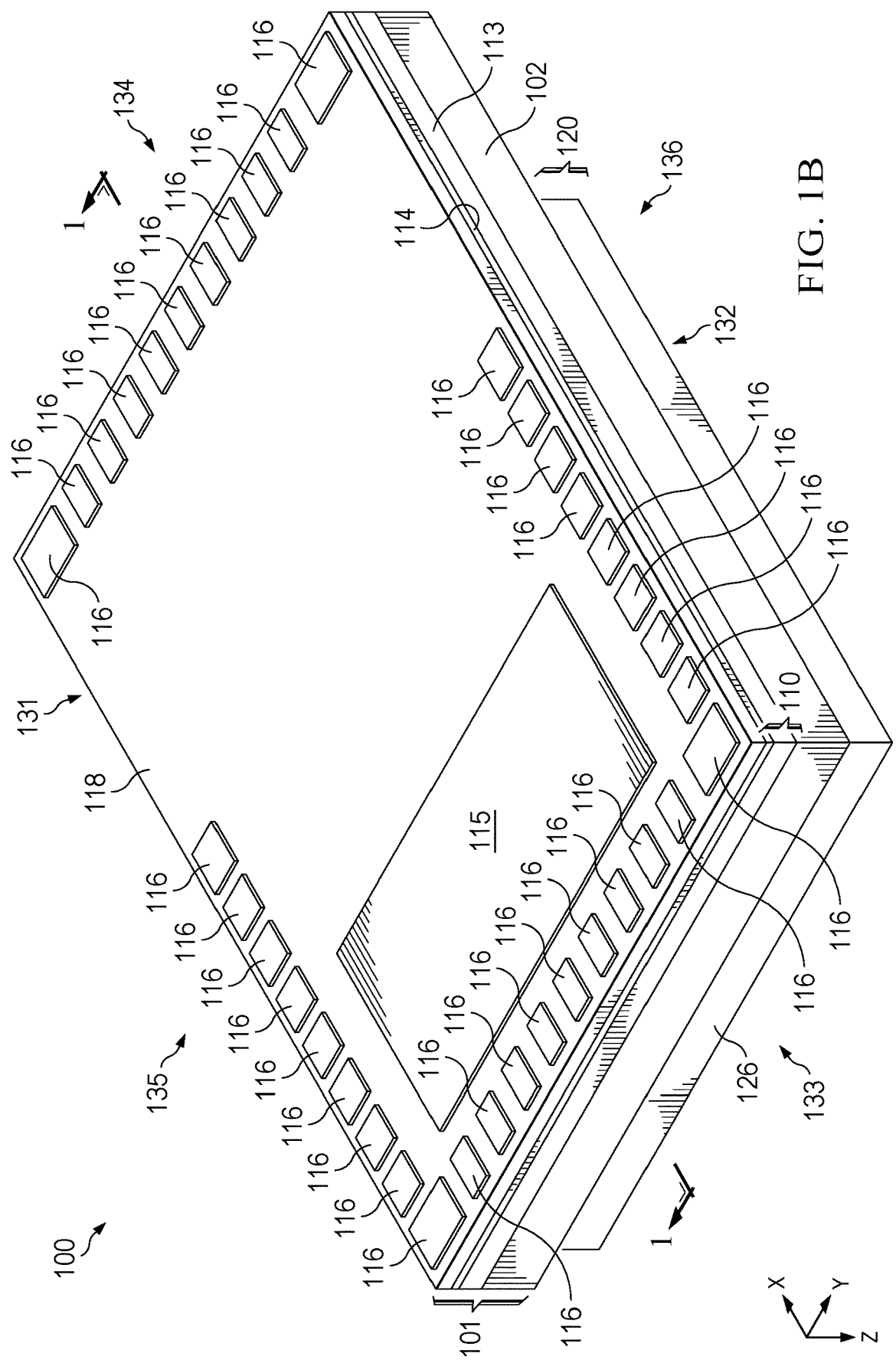
FIG. 1B is a bottom perspective view of the electronic device of FIG. 1.

FIGS. 1-1B show an electronic device 100 with an embedded die, a thin copper layer on the back side of the die, and a thermally conductive insulating layer (TCIL) between the embedded die and a heat spreader metal plate. The TCIL facilitates removal of heat from the embedded die without unnecessarily reducing the thickness of the externally exposed metal plate. In addition, the TCIL provides electrical isolation of the heat spreader metal plate from circuitry of the embedded die and may reduce parasitic inductance to allow or enhance high-frequency operation, particularly for gallium nitride transistors of an embedded die. In addition, the TCIL can mitigate or avoid embedded die cracking, and provides advantages compared to copper post solutions and/or reduced heat spreader metal plate thickness.

FIG. 1 shows a partial cross section view of the electronic device 100 taken along lines 1-1 of FIGS. 1A and 1B. FIG. 1A shows a top view of the electronic device 100, and FIG. 1B shows a bottom view of the electronic device 100. The electronic device 100 includes an embedded die frame 101 with a single or multilayer organic laminate structure 102 that is or includes materials used in the manufacture of printed circuit boards, for example, glass-reinforced epoxy laminate material, such as flame resistant or flame retardant national electrical manufacturers association (NEMA) FR4 that includes woven fiberglass cloth with the epoxy resin binder materials. The embedded die frame 101 in one example includes one or more copper posts or vias 103 that extend between bottom and top sides of the embedded die frame 101 and/or between trace layers thereof. The illustrated example is a single layer embedded die frame 101 with a dielectric material 104 having a generally planar top surface or side 105 in a cavity 106 along with semiconductor dies 107 and 108. The electronic device 100 is illustrated in FIGS. 1-1B in an example position in a three-dimensional space with a first direction X, and an orthogonal (e.g., perpendicular) second direction Y, and a third direction Z that is orthogonal (e.g., perpendicular) to the respective first and second directions X and Y.

The semiconductor die 107 in this example is a driver die including driver circuitry, for example, for a switching power converter or communications device, and the semiconductor die 108 is a transistor die that includes one or more power transistors. In this example, the transistor die 108 includes high power circuitry capable of operating at high voltage levels and switching at high frequencies. The semiconductor die 108 has a first or lower side and an opposite second or upper side 109 that is substantially coplanar with the top side 105 of the dielectric material 104 in the cavity 106.

The embedded die frame 101 has a routing structure 110. As shown in FIG. 1, the example routing structure 110 provides two routing layers with via structures providing interconnections between the routing layers. In other examples, a single routing layer is provided, or another integer number of routing layers can be included. A first or upper level of the routing structure 110 includes conductive metal (e.g., aluminum or copper) routing lines or traces 111 and first conductive metal (e.g., aluminum or copper) vias 112, along with electrically insulating (e.g., dielectric) material 113 laterally between and around the traces 111 and vias 112. The second or lower level of the routing structure 110 includes conductive metal (e.g., aluminum or copper) traces 114 and vias 115, 116 with insulating dielectric material 118 laterally between and around the traces 114 and the vias 115, 116. As further shown in FIG. 1B, the conductive via feature 115 provides a terminal that can be soldered to a host PCB (not shown), such as for a circuit ground or other reference voltage node of the circuitry provided by the semiconductor dies 107 and 108. In this example, moreover, the conductive via features 116 form device leads or terminals that can be soldered to such a host PCB for electrical circuit connections between the host PCB and the electronic device 100. The vias 115 and 116 in this example extend downward beyond the lower surface of the dielectric material 118 to facilitate soldering of the electronic device 100 to the host PCB, as shown in FIG. 1.

The electronic device 100 also includes a heat spreader 120 (FIGS. 1 and 1A) and a metal layer 121 (FIG. 1). In the illustrated example, the metal layer 121 is or includes copper or aluminum or other electrically and thermally conductive metal. The heat spreader 120 includes a thermally conductive insulator layer (TCIL) with an adhesive sublayer 122 with a thickness 123 and a resin sublayer 124 with a thickness 125. The heat spreader 120 also includes a thick metal plate 126, such as aluminum or copper having a thickness 127. The adhesive sublayer 122 extends on a lower or first side of the thermally conductive insulator layer 122, 124 and over the side 109 of the semiconductor die 108. The resin sublayer 124 extends between an upper or second side of the thermally conductive insulator layer 122, 124 and the adhesive sublayer 122 (e.g., along the third direction Z in the illustrated orientation), and the metal plate 126 extends on the resin sublayer 124. The adhesive sublayer 122 and the resin sublayer 124 are both electrical insulators with good thermal transfer performance (e.g., low thermal resistance).

In one example, the adhesive layer thickness 123 is approximately 20 to 50 µm, such as approximately 38 µm, where higher values can be undesirable with respect to increased package height of the device 100, and lower values may be insufficient for proper adherence of the heat spreader 120. In this or another example, the resin sublayer thickness 125 is approximately 100 µm, where a significantly thinner resin sublayer can reduce the rated electrical isolation level between circuitry of the semiconductor dies 107 and 108 and the metal plate 126. A thicker resin sublayer 124 can be used, for example, to increase the electrical isolation level.

In these or further examples, the metal plate 126 is or includes copper, and the thickness 127 is approximately 200-400 µm. The metal plate thickness 127 can be adjusted higher (e.g., within or outside this range), for example, to increase heat removal and reduce the thermal resistance of the heat spreader 120, although increased metal plate thicknesses 127 can increase the height of the packaged electronic device 100. In the illustrated examples, the metal plate thickness 127 is greater than the total thickness 123, 125 of the TCIL sublayers 122 and 124. The metal layer 121 has a thickness 128 that is less than the metal plate thickness 127, and in one example provides an electrical connection from the back side 109 of the semiconductor die 108 through the illustrated copper via 103 and one of the first level conductive traces 111 to a conductive feature (not shown) of the driver die 107.

In the above or other examples, the metal layer thickness 128 is approximately 10 µm or more and 50 µm or less µm, such as approximately 10 µm. Lower metal layer thicknesses 128 can inhibit the functionality of the layer 126 to convey electrical signals in the electronic device. Moreover, as previously discussed, significantly higher metal layer thicknesses 128 can lead to undesirable substrate cracking in the semiconductor die 108.

As shown in FIGS. 1-1B, the electronic device 100 has a bottom side 131 and an opposite top side 132 that are spaced apart from one another along the third direction Z, as well as opposite third and fourth sides 133 and 134 spaced apart from one another along the first direction X, and opposite fifth and sixth sides 135 and 136 that are spaced apart from one another along the second direction Y. As shown in FIG. 1, the semiconductor die 108, which can be referred to as a GaN die, includes a silicon substrate 141 and a gallium nitride layer 142 on the silicon substrate 141, with one or more gallium nitride transistors (not shown) formed on and/or in the gallium nitride layer 142. The semiconductor die 108 is positioned in the cavity 106 of the embedded die frame 101 with the gallium nitride layer 142 on the routing structure 110. In one example, the semiconductor die 108 is flip chip attached with solder connections from conductive features of the semiconductor die 108 to conductive features of the routing structure 110, for example, to provide connections from the gallium nitride transistor or transistors of the semiconductor die 108 to the routing structure 110. In this example, the driver die 107 is flip chip attached to form electrical connections to the routing structure 110 of the embedded die frame 101.

The thermally conductive insulator layer 122, 124 has a first or lower side that faces the embedded die frame 101 and an opposite second or upper side that faces away from the embedded die frame 101. A portion of the first side of the thermally conductive insulator layer 122, 124 extends over the side 109 of the silicon substrate 141, and the metal plate 126 extends on the second side of the thermally conductive insulator layer 122, 124. The lower or first side of the thermally conductive insulator layer 122, 124 extends over, and is thermally coupled to, the side 109 of the semiconductor die 108. This provides thermal coupling between the semiconductor substrate 141 at the back side 109 of the semiconductor die 108 and the heat spreader 120. In this example, the thermal coupling of the semiconductor die 108 to the heat spreader 120 is through the thermally conductive thin metal layer 121. In another example (e.g., FIGS. 2-2B below), the metal layer 121 is omitted, and the TCIL 122, 124 can be directly attached to the back side 109 of the semiconductor die 108.

In the example of FIGS. 1-1B, a portion of the first or lower side of the metal layer 121 extends on the side 109 of the silicon substrate 141, as well as on to portions of the top side 105 of the dielectric material 104 in the cavity 106, and the metal layer 120 extends onto the top of the via 103 in order to provide an electrical signal connection between the semiconductor dies 107 and 108. In this example, moreover, a portion of the metal layer 121 extends onto a portion of the multilayer organic laminate structure 102 of the embedded die frame 101.

Figure 2:
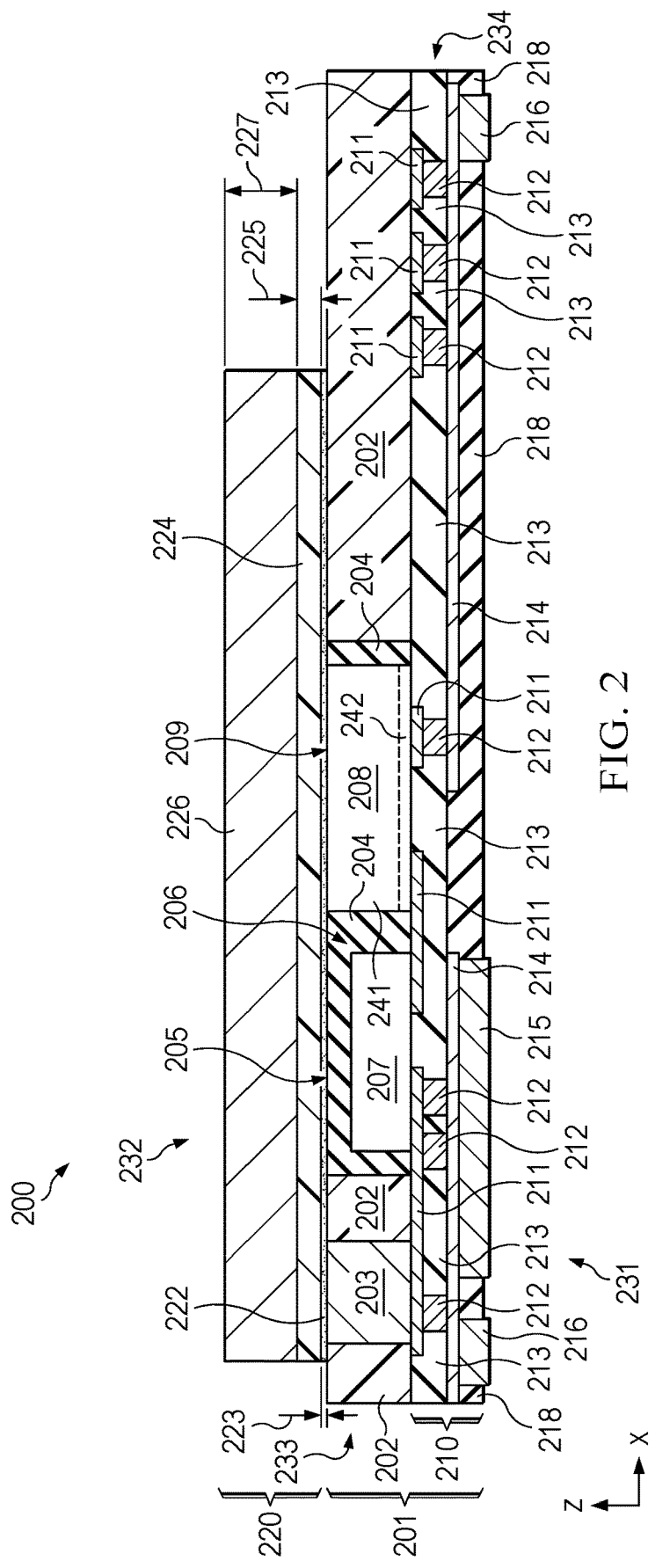
FIG. 2 is a partial sectional side elevation view of an electronic device with an embedded die package and a thermally conductive insulating layer on a die backside.
Figure 2B:
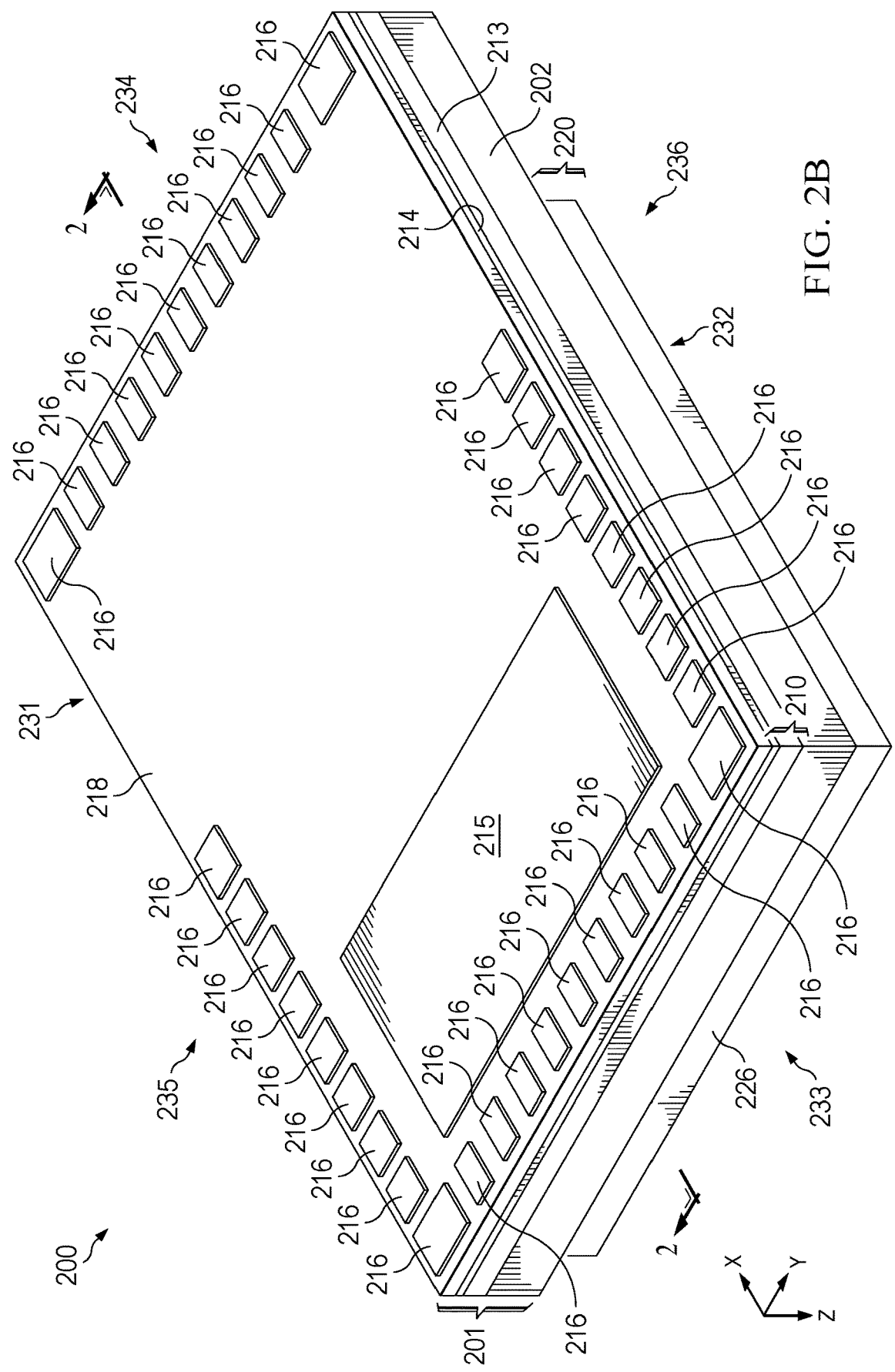
FIG. 2B is a bottom perspective view of the electronic device of FIG. 2.

Referring now to FIGS. 2-2B, another example embedded die electronic device 200 includes some of the above discussed features, without a metal layer on the side of the semiconductor die, in which a thermally conductive insulator layer is directly on the back side of the semiconductor die. This further facilitates heat removal from the semiconductor die to the heat spreader, for example, and is particularly attractive where no backside die electrical connections are needed in the device 200.

FIG. 2 shows a partial cross section view of the electronic device 200 taken along lines 2-2 of FIGS. 2A and 2B. FIG. 2A shows a top view of the electronic device 200, and FIG. 2B shows a bottom view of the electronic device 200. The electronic device 200 includes an embedded die frame 201 with a single or multilayer organic laminate structure 202 that is or includes materials used in the manufacture of printed circuit boards, for example, glass-reinforced epoxy laminate material, such as flame resistant or flame retardant national electrical manufacturers association (NEMA) FR4 that includes woven fiberglass cloth with the epoxy resin binder materials. The embedded die frame 201 in one example includes one or more copper posts or vias 203 that extend between bottom and top sides of the embedded die frame 201 and/or between trace layers thereof. The illustrated example is a single layer embedded die frame 201 with a dielectric material 204 having a generally planar top surface or side 205 in a cavity 206 along with semiconductor dies 207 and 208. The electronic device 200 is illustrated in FIGS. 2-2B in an example position in a three-dimensional space with a first direction X, and an orthogonal (e.g., perpendicular) second direction Y, and a third direction Z that is orthogonal (e.g., perpendicular) to the respective first and second directions X and Y.

The semiconductor die 207 in this example is a driver die including driver circuitry, for example, for a switching power converter or communications device, and the semiconductor die 208 is a transistor die that includes one or more power transistors. In this example, the transistor die 208 includes high power circuitry capable of operating at high voltage levels and switching at high frequencies. The semiconductor die 208 has a first or lower side and an opposite second or upper side 209 that is substantially coplanar with the top side 205 of the dielectric material 204 in the cavity 206.

The embedded die frame 201 has a routing structure 210. As shown in FIG. 2, the example routing structure 210 provides two routing layers with via structures providing interconnections between the routing layers. In other examples, a single routing layer is provided, or another integer number of routing layers can be included. A first or upper level of the routing structure 210 includes conductive metal (e.g., aluminum or copper) routing lines or traces 211 and first conductive metal (e.g., aluminum or copper) vias 212, along with electrically insulating (e.g., dielectric) material 213 laterally between and around the traces 211 and vias 212. The second or lower level of the routing structure 210 includes conductive metal (e.g., aluminum or copper) traces 214 and vias 215, 216 with insulating dielectric material 218 laterally between and around the traces 214 and the vias 215, 216. As further shown in FIG. 2B, the conductive via feature 215 provides a terminal that can be soldered to a host PCB (not shown), such as for a circuit ground or other reference voltage node of the circuitry provided by the semiconductor dies 207 and 208. In this example, moreover, the conductive via features 216 form device leads or terminals that can be soldered to such a host PCB for electrical circuit connections between the host PCB and the electronic device 200. The vias 215 and 216 in this example extend downward beyond the lower surface of the dielectric material 218 to facilitate soldering of the electronic device 200 to the host PCB, as shown in FIG. 2.

The electronic device 200 also includes a heat spreader 220 (FIGS. 2 and 2A) with a thermally conductive insulator layer (TCIL) with an adhesive sublayer 222 with a thickness 223 and a resin sublayer 224 with a thickness 225. The heat spreader 220 also includes a thick metal plate 226, such as aluminum or copper having a thickness 227. The adhesive sublayer 222 extends on a lower or first side of the thermally conductive insulator layer 222, 224 and over the side 209 of the semiconductor die 208. The resin sublayer 224 extends between an upper or second side of the thermally conductive insulator layer 222, 224 and the adhesive sublayer 222 (e.g., along the third direction Z in the illustrated orientation), and the metal plate 226 extends on the resin sublayer 224. The adhesive sublayer 222 and the resin sublayer 224 are both electrical insulators with good thermal transfer performance (e.g., low thermal resistance).

In one example, the adhesive layer thickness 223 is approximately 20 to 50 μm, such as approximately 38 μm, where higher values can be undesirable with respect to increased package height of the device 200, and lower values may be insufficient for proper adherence of the heat spreader 220. In this or another example, the resin sublayer thickness 225 is approximately 200 μm, where a significantly thinner resin sublayer can reduce the rated electrical isolation level between circuitry of the semiconductor dies 207 and 208 and the metal plate 226. A thicker resin sublayer 224 can be used, for example, to increase the electrical isolation level.

In these or further examples, the metal plate 226 is or includes copper, and the thickness 227 is approximately 200-400 μm. The metal plate thickness 227 can be adjusted higher (e.g., within or outside this range), for example, to increase heat removal and reduce the thermal resistance of the heat spreader 220, although increased metal plate thicknesses 227 can increase the height of the packaged electronic device 200. In the illustrated examples, the metal plate thickness 227 is greater than the total thickness 223, 225 of the TCIL sublayers 222 and 224.

In the above or other examples, the metal layer thickness 228 is approximately 10 μm or more and 50 μm or less μm, such as approximately 10 μm. Lower metal layer thicknesses 228 can inhibit the functionality of the layer 226 to convey electrical signals in the electronic device. Moreover, as previously discussed, significantly higher metal layer thicknesses 228 can lead to undesirable substrate cracking in the semiconductor die 208.

As shown in FIGS. 2-2B, the electronic device 200 has a bottom side 231 and an opposite top side 232 that are spaced apart from one another along the third direction Z, as well as opposite third and fourth sides 233 and 234 spaced apart from one another along the first direction X, and opposite fifth and sixth sides 235 and 236 that are spaced apart from one another along the second direction Y. As shown in FIG. 2, the semiconductor die 208, which can be referred to as a GaN die, includes a silicon substrate 241 and a gallium nitride layer 242 on the silicon substrate 241, with one or more gallium nitride transistors (not shown) formed on and/or in the gallium nitride layer 242. The semiconductor die 208 is positioned in the cavity 206 of the embedded die frame 201 with the gallium nitride layer 242 on the routing structure 210. In one example, the semiconductor die 208 is flip chip attached with solder connections from conductive features of the semiconductor die 208 to conductive features of the routing structure 210, for example, to provide connections from the gallium nitride transistor or transistors of the semiconductor die 208 to the routing structure 210. In this example, the driver die 207 is flip chip attached to form electrical connections to the routing structure 210 of the embedded die frame 201.

The thermally conductive insulator layer 222, 224 has a first or lower side that faces the embedded die frame 201 and an opposite second or upper side that faces away from the embedded die frame 201. A portion of the first side of the thermally conductive insulator layer 222, 224 extends over the side 209 of the silicon substrate 241, and the metal plate 226 extends on the second side of the thermally conductive insulator layer 222, 224. The lower or first side of the thermally conductive insulator layer 222, 224 extends over, and is thermally coupled to, the side 209 of the semiconductor die 208. This provides thermal coupling between the semiconductor substrate 241 at the back side 209 of the semiconductor die 208 and the heat spreader 220. In this example, the thermal coupling of the semiconductor die 208 to the heat spreader 220 is direct, and the TCIL 222, 224 is directly attached to the back side 209 of the semiconductor die 208.

Referring now to FIGS. 3-15, FIG. 3 shows a method 300 of fabricating an electronic device and FIGS. 3-15 show the example electronic device 100 undergoing fabrication processing according to the method 300. The method 300 begins at 302 with a starting organic frame panel and routing structure with rows and columns of unit regions and respective unit region cavities. FIG. 4 shows one example of a starting embedded die frame 101 with the cavity 106 as previously described, in which a panel structure includes multiple unit regions arranged in rows and columns (not shown).

Figure 3:
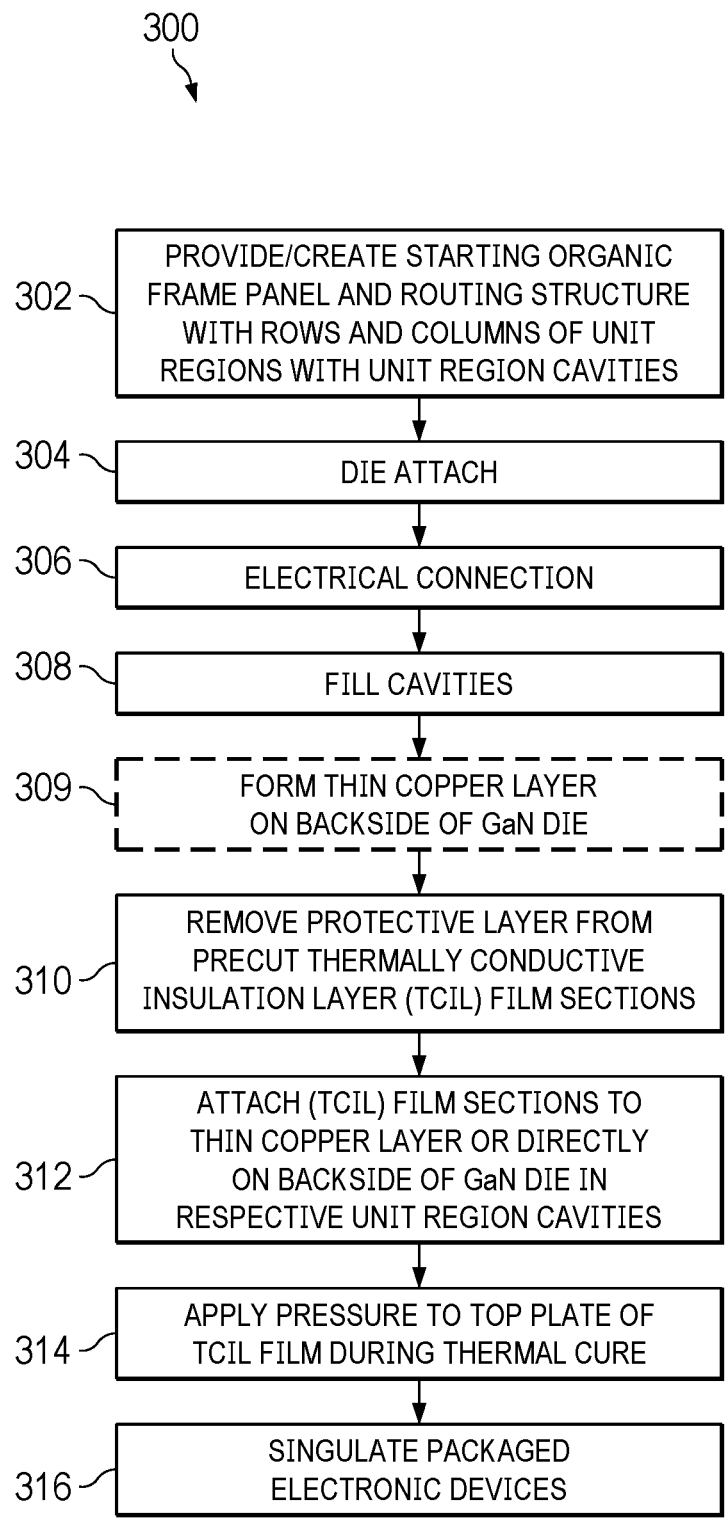
FIG. 3 is a flow diagram of a method of fabricating an electronic device.
Figure 4:
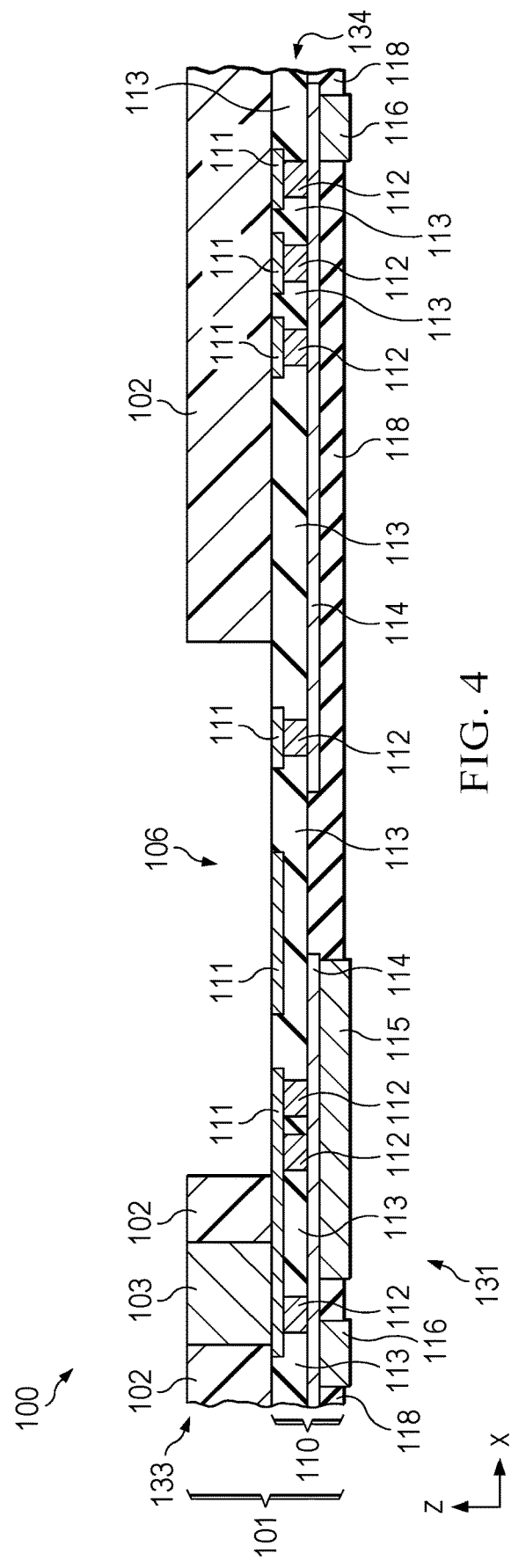
FIGS. 4-15 are partial sectional side elevation views of an electronic device undergoing fabrication processing according to the method of FIG. 3.
Figure 5:
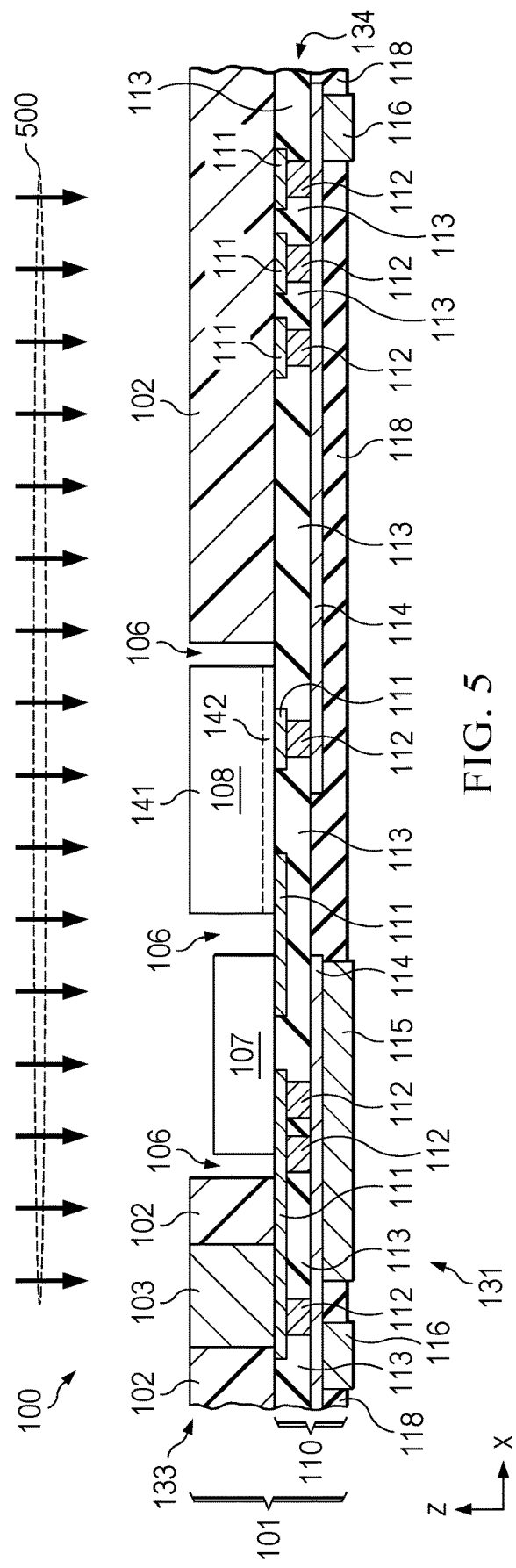

The method 300 continues in FIG. 3 at 304 with die attach processing. FIG. 5 shows one example, in which a die attach process 500 is performed. The semiconductor dies 107 and 108 are flip chip attached to conductive features of the routing structure 110 in the cavity 106 for the illustrated unit region. In one implementation, the die attach process 500 is an automated procedure including pick and place mechanisms (not shown) that sequentially or concurrently pick the semiconductor dies 107 and 108 from a carrier structure (not shown) for placement on the desired location of the routing structure 110 in each unit region cavity 106 of the array. The semiconductor die 108 in this example is attached at 304 with the back side 109 of the semiconductor die 108 facing away from the routing structure 110. This facilitates thermal coupling of the silicon substrate 141 of the semiconductor die 108 along the side 109 with the subsequently attached heat spreader 120.

Figure 6:
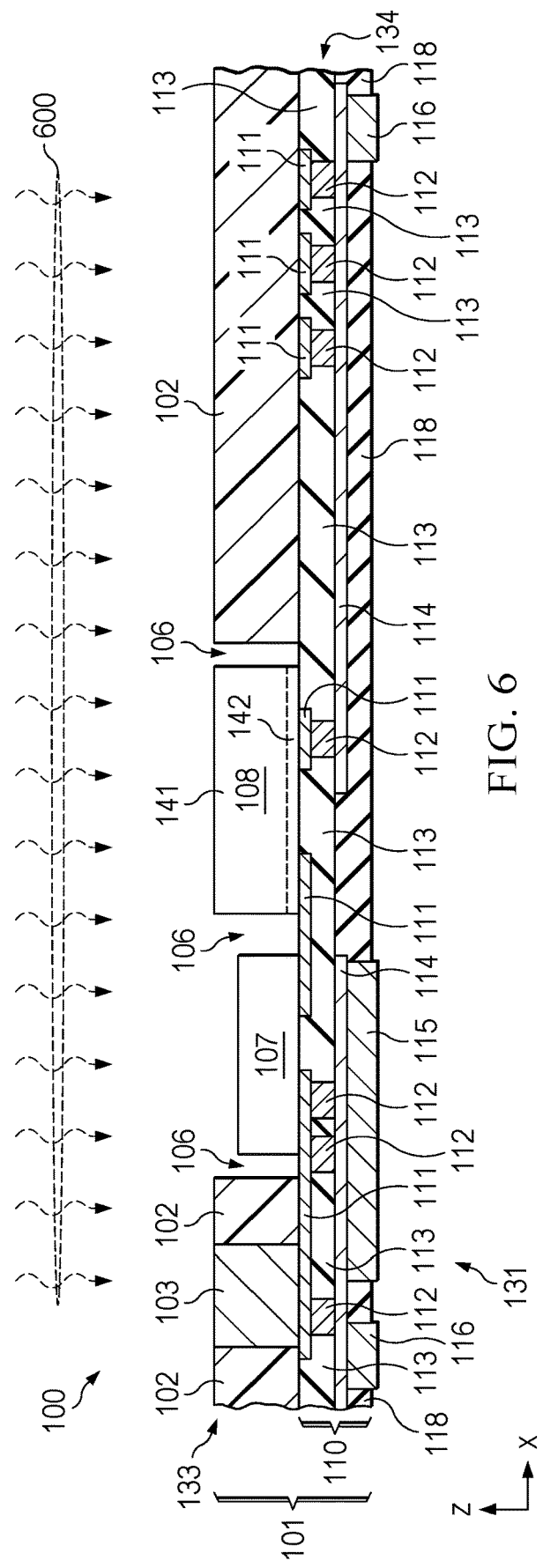

The method 300 also includes electrical connection formation at 306. In the illustrated implementation, the connection processing at 306 includes thermal reflowing of solder as part of a flip chip attachment procedure. FIG. 6 illustrates one example, in which the array undergoes a thermal process 600 that reflows the solder to form solder connections between conductive features on the bottom sides of the semiconductor dies 107 and 108 and corresponding conductive features in the first trace level of the routing structure 110 in the cavities 106 of each unit region of the array. In another implementation, bond wire connections can be formed between conductive features of one or more of the dies 107, 108 and other connection points in the electronic device 100 (not shown).

Figure 7:
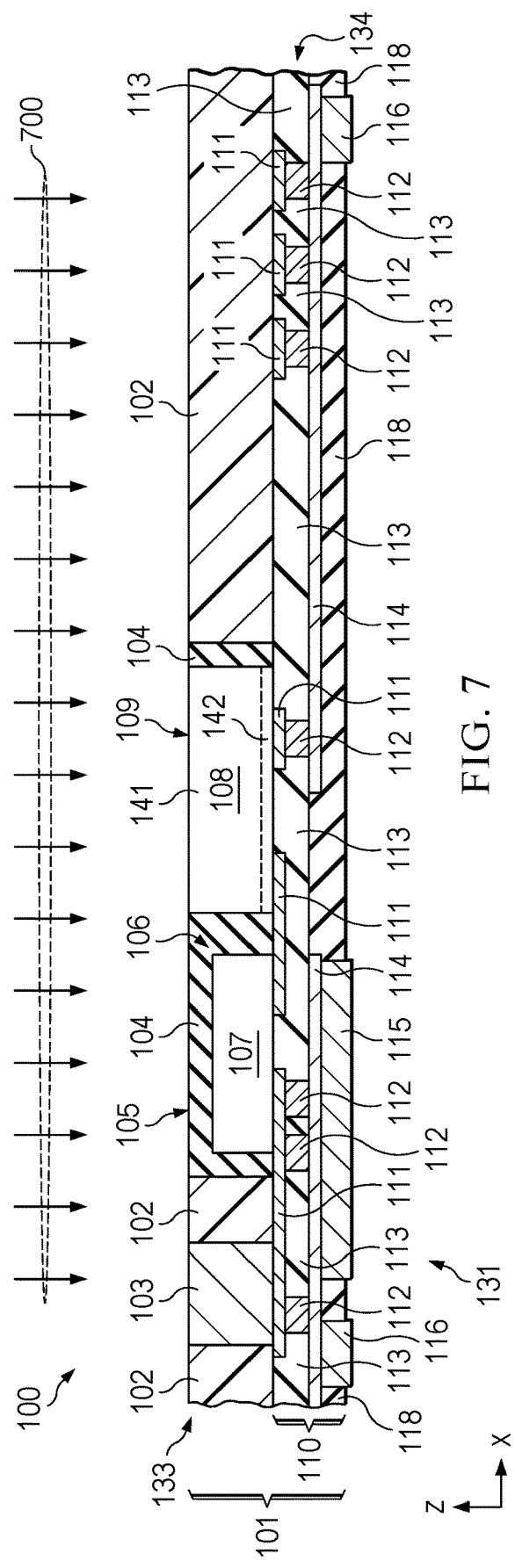

At 308 in FIG. 3, the method 300 in this example includes filling the cavities in the respective unit regions of the panel array. FIG. 7 shows one example, in which a screening process 700 is performed that deposits or otherwise forms the dielectric material 104 in the cavities 106, and a squeegee or other apparatus is translated across the top side of the panel array to form the top side 105 of the dielectric material 104 that is substantially coplanar with the top side of the organic laminate structure 102 of the embedded die structure 101. The process 700, moreover, leaves the top side 109 of the semiconductor die 108 exposed.

Figure 8:
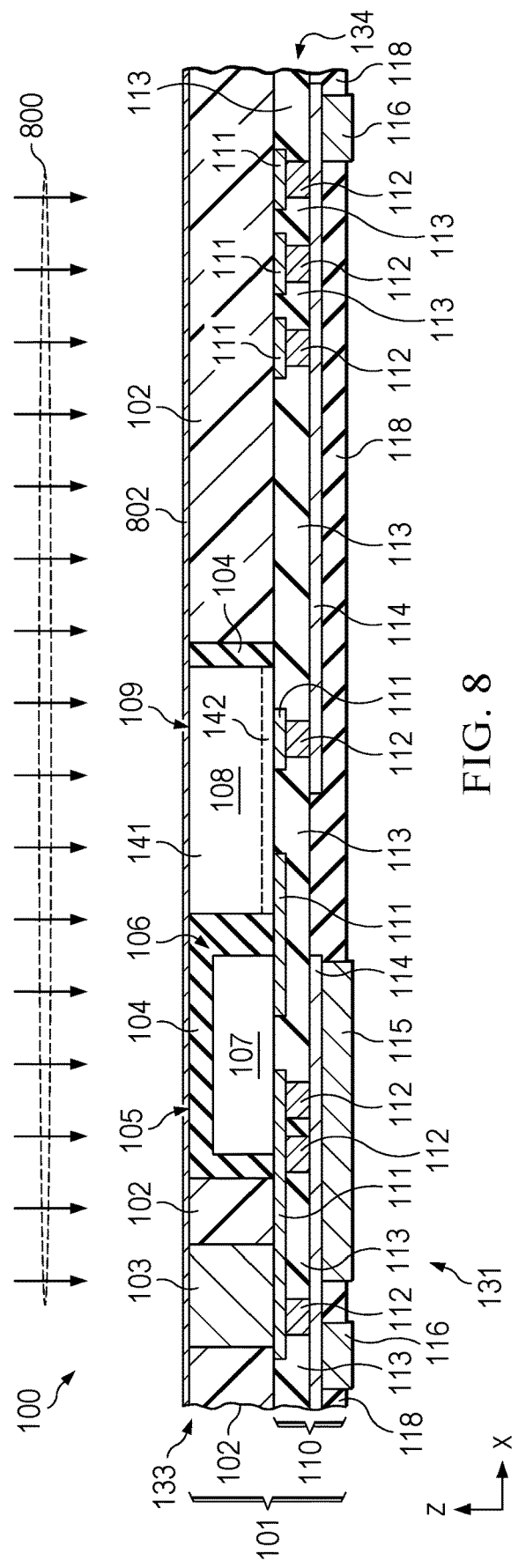
Figure 9:
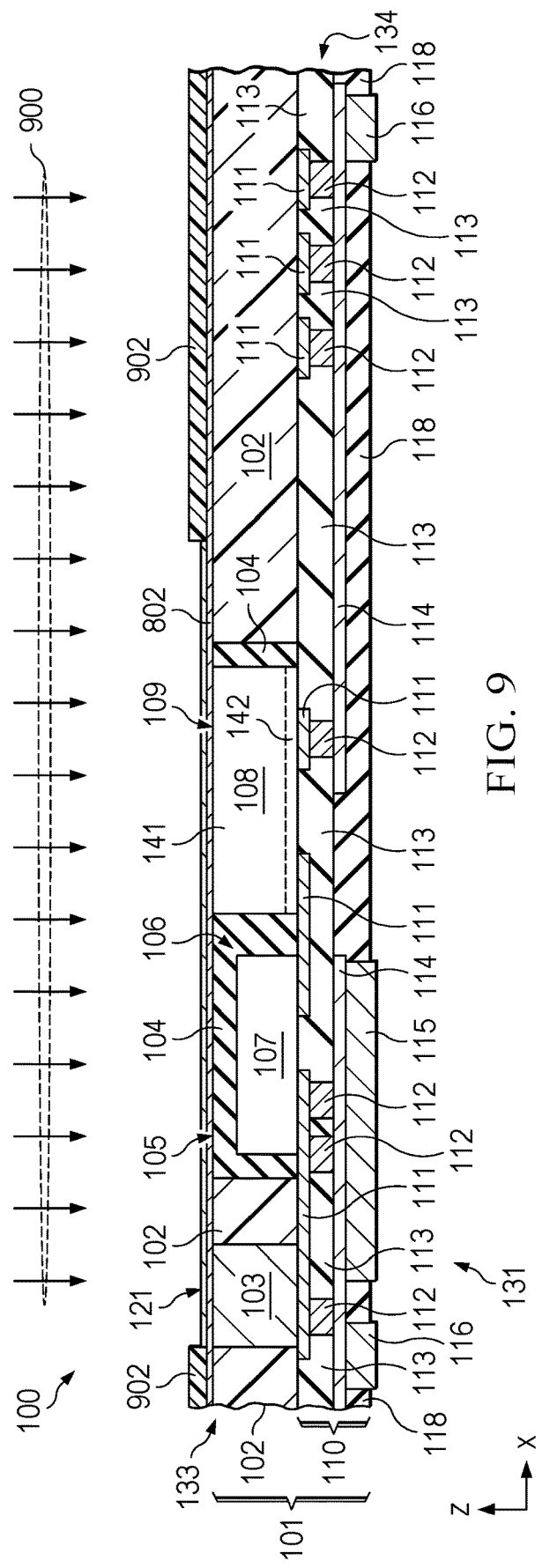
Figure 10:
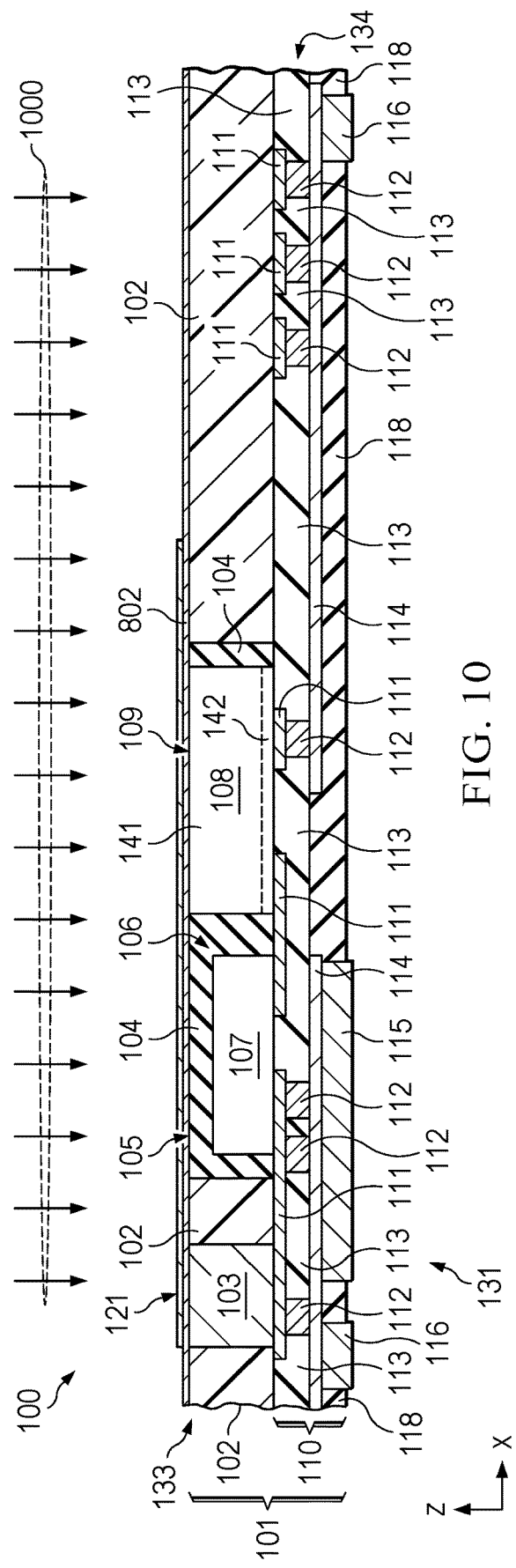
Figure 11:
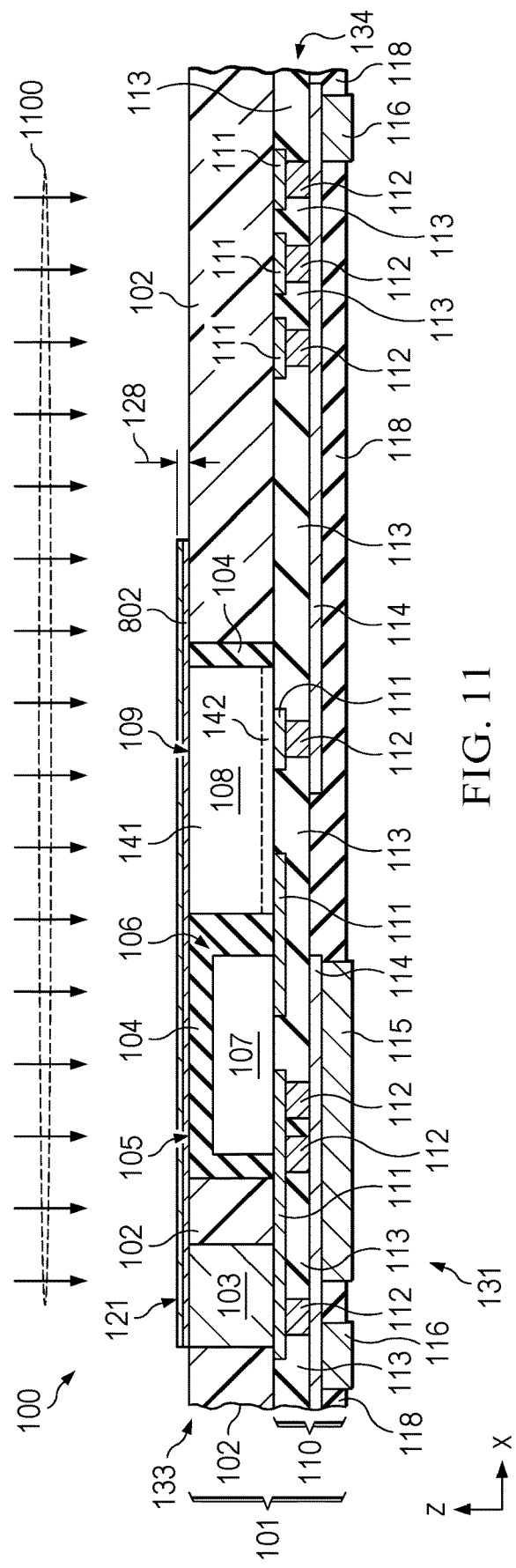

In one implementation, the method 300 includes forming a thin copper layer on the back side of the semiconductor die 108 at 309. As discussed above in connection with FIGS. 2-2B, the thin metal layer formation at 309 can be omitted, with the heat spreader subsequently attached directly to the side 109 of the semiconductor die 108. In the case where the metal layer 121 is included in the electronic device 100, FIGS. 8-11 illustrate one example implementation of the thin metal layer formation at 309. FIG. 8 shows this example, in which a deposition process 800 (e.g., chemical vapor deposition or CVD) is performed that forms a thin copper seed layer 802 along the top side of the entire array panel, which extends on the top sides of the multilayer organic laminate structure 102, the copper via 103, the dielectric material 104, and the backside of the semiconductor die 108. This example continues with a masked electroplating process 900 in FIG. 9, which electroplates copper material to form the thin metal layer 121 in portions that are not covered by a plating mask 902. In FIG. 10, the copper layer formation at 309 continues with a process 1000 that removes the plating mask, and a cleaning or stripping process 1100 is performed in FIG. 11 that removes the remnant copper seed layer from the previously masked portions of the laminate structure 102. The processing in FIGS. 8-11 leaves the formed metal layer 121 having the thickness 128 as shown in FIG. 11.

Figure 12:
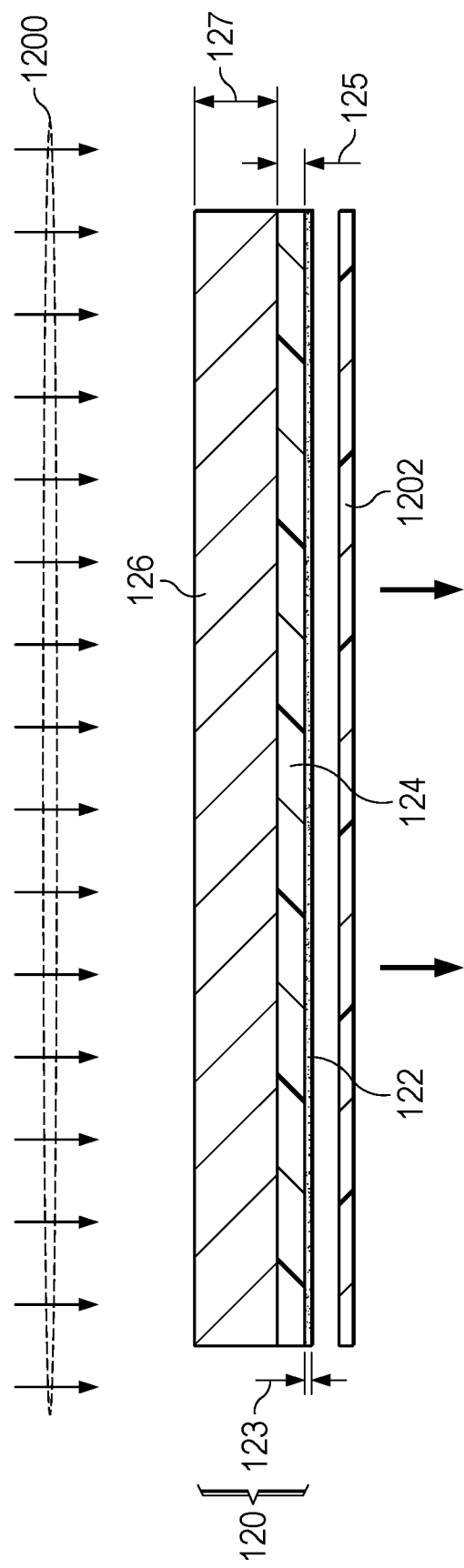

The method 300 continues at 310 in FIG. 3 with preparing a precut TCIL structure for attachment to each individual unit region of the panel array. FIG. 12 shows one example, in which a precut section of the TCIL 122 and 124, including the previously attached metal plate 126 and a protection layer 1202 is prepared for pick and place attachment in a respective unit region of the panel array. The protection layer 1202 in this example covers the adhesive layer 122 of the TCIL prior to use in the fabrication process 300. Individual units of the TCIL 122, 124 and the respective metal plate 126 are manufactured as units including the protection layer 1202, and a process 1200 is performed in FIG. 12 that removes (e.g., peels) the protection layer 1202 from the adhesive layer 122 along the direction indicated in the drawing.

Figure 13:
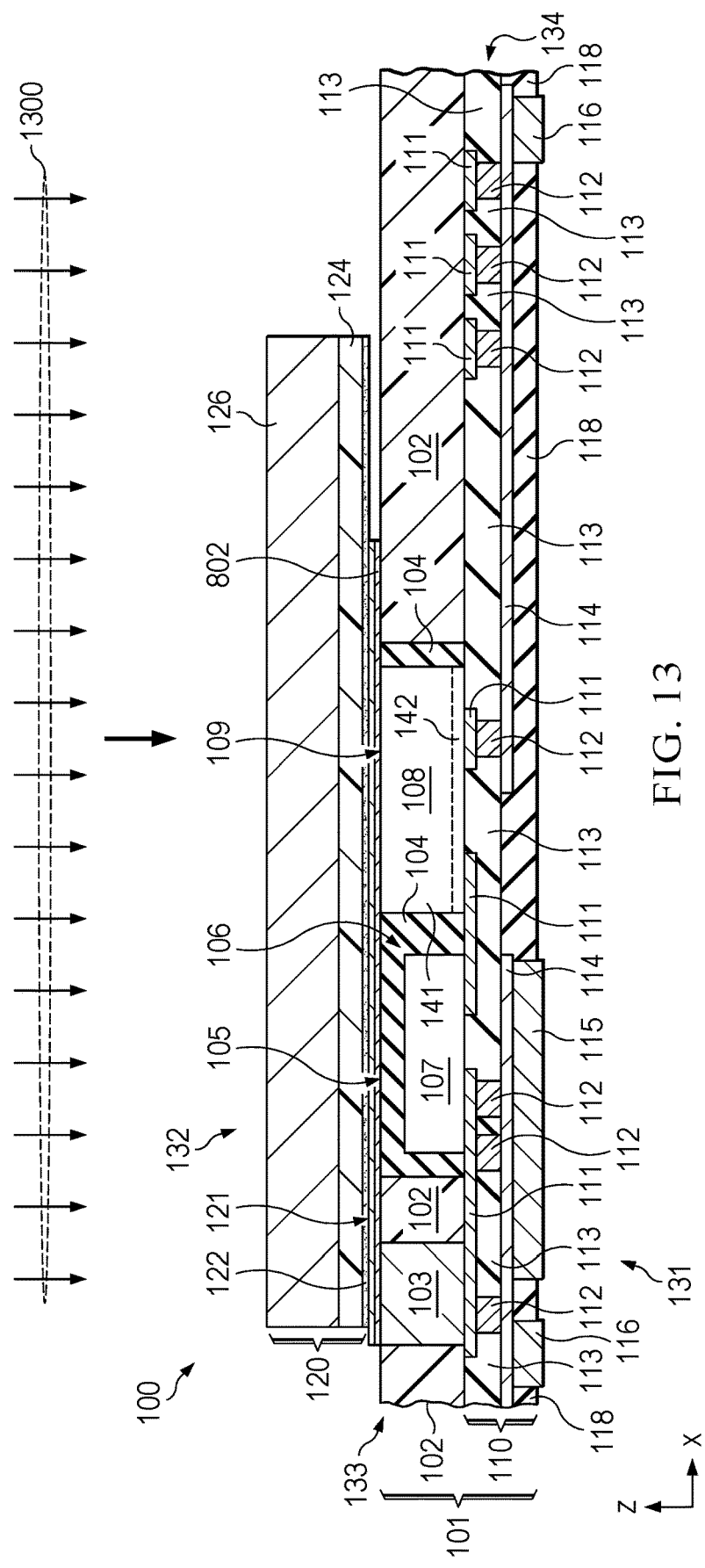
Figure 13A:
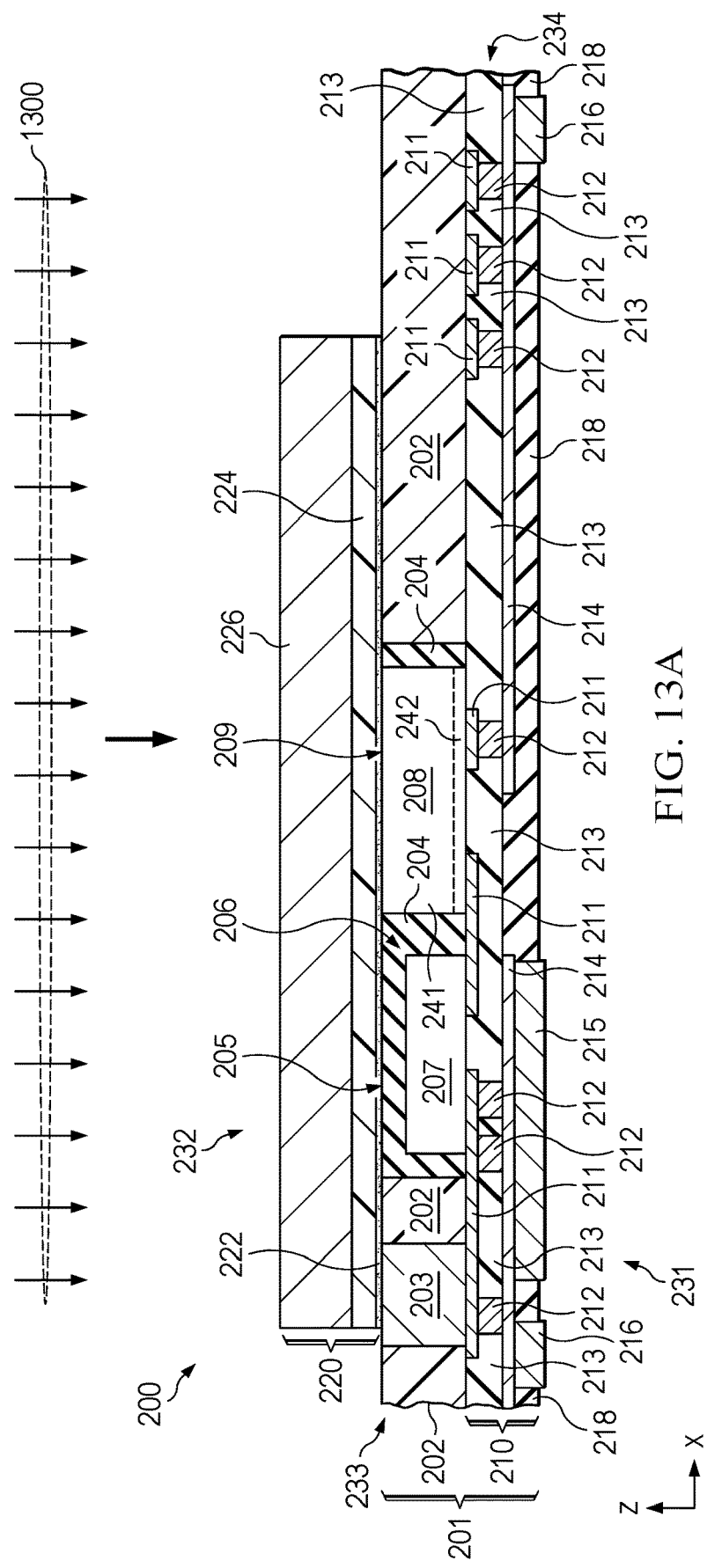
Figure 14:
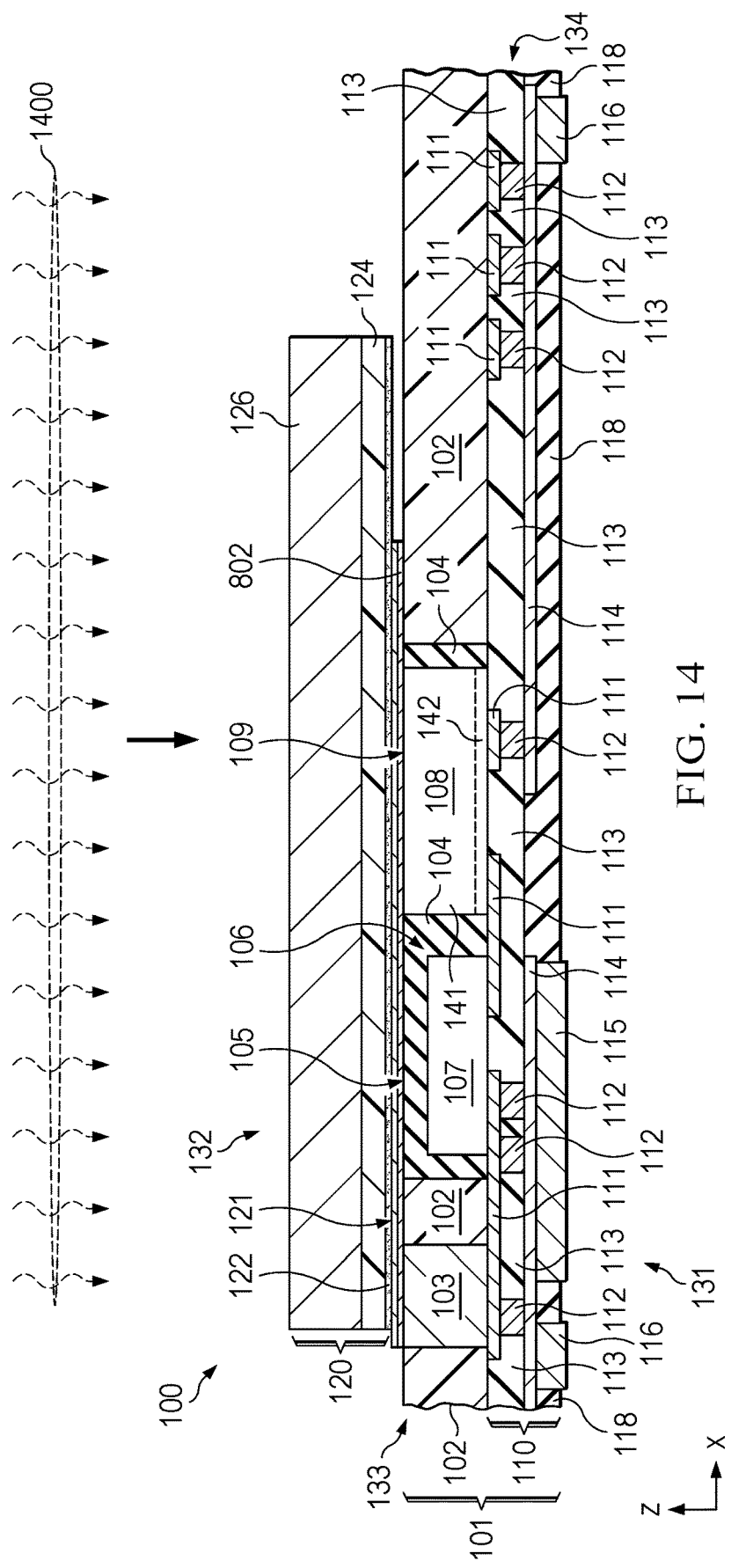

Referring also to FIGS. 13 and 13A, the method 300 continues at 312 with attaching the heat spreader 120 including the TCIL film section 122, 124 and metal plate 126. FIG. 13 shows one example, in which an attachment process 1300 is performed, for example, using automated pick and place equipment (not shown), that attaches the prepared TCIL and metal plate structure 122, 124, 126 at the desired location directly on the top side of the metal layer 121 above the top sides of the organic laminate structure 102, above a portion of the copper via 103, above a portion or all of the top side of the dielectric material 104, and above the top side of the semiconductor die 108 along the direction indicated in the figure. FIG. 13A shows another example for the case where no copper layer 121 is used (e.g., copper layer formation at 309 in FIG. 3 omitted), in which the electronic device 200 undergoes an attachment process 1300, which attaches the prepared TCIL and metal plate structure 122, 124, 126 at the desired location along the top sides of the organic laminate structure 102, a portion of the copper via 103, a portion or all of the top side of the dielectric material 104 and the top side of the semiconductor die 108 along the direction indicated in the figure.

The method 300 continues at 314 in FIG. 3 with applying pressure in the indicated downward direction to the metal plate 126 during a thermal cure process 1400 to cure the adhesive sublayer 122 to adhere the first side of the thermally conductive insulator layer 122, 124 to the metal layer 121 (or directly to the top side 209 of the semiconductor die 208 for the electronic device 200 discussed above). In one example, the thermal process 1400 is performed at approximately 180° C. for a duration of approximately five minutes to properly adhere the TCIL 122, 124 to the metal layer 121.

Figure 15:
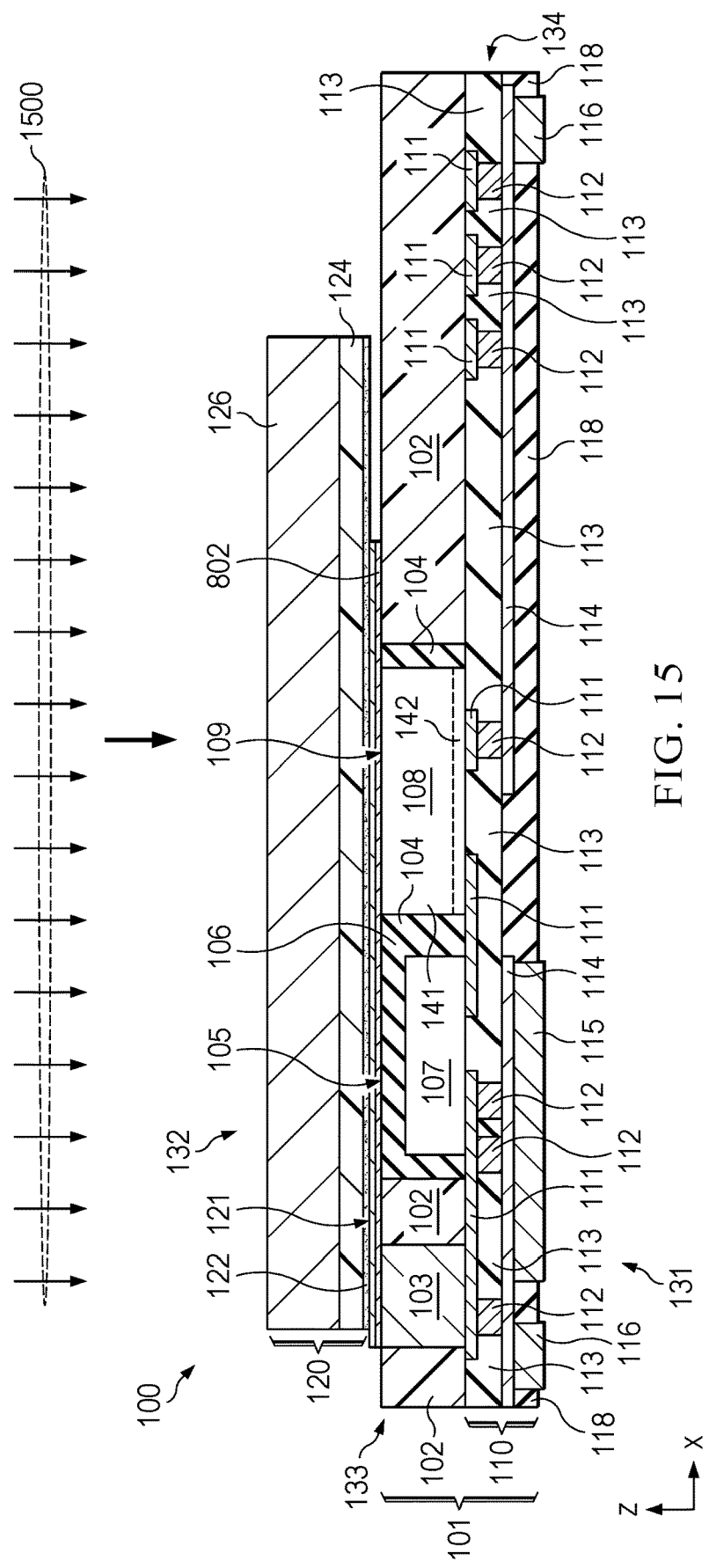

The method 300 in FIG. 3 further includes packaged electronic device singulation at 316. FIG. 15 shows one example, in which a saw cutting or other packaged electronic device separation process 1500 is performed that separates individual packaged electronic devices 100 from the starting panel array. This completes the example electronic device 100 of FIGS. 1-1B (or the electronic device 200 of FIGS. 2-2B) as illustrated and described above. The method 300 provides advantages compared with prior approaches, including lower complexity compared with the use of copper posts between the embedded die and the metal plate heat spreader, as well as facilitating reduction or avoidance of mechanical stress during thermal cycling due to CTE mismatch between thicker metal plates and the semiconductor substrate 144 of the semiconductor die 108.

Modifications are possible in the described examples, and other implementations are possible, within the scope of the claims.

What is claimed is:

1. An electronic device, comprising:
   a semiconductor die in a cavity of an embedded die frame;
   a thermally conductive insulator layer having a first side and an opposite second side, the first side of the thermally conductive insulator layer over and thermally coupled to a side of the semiconductor die; and
   a metal plate on the second side of the thermally conductive insulator layer.

2. The electronic device of claim 1, further comprising a metal layer having a first side and an opposite second side, a portion of the first side of the metal layer on the side of the semiconductor die, wherein the first side of the thermally conductive insulator layer is directly on contacts the second side of the metal layer.

3. The electronic device of claim 2, wherein the metal layer includes copper and the metal plate includes copper.

4. The electronic device of claim 2, wherein the metal plate has a first thickness, the metal layer has a second thickness, and the first thickness is greater than the second thickness.

5. The electronic device of claim 2, wherein the metal layer has a thickness of approximately 10 µm or more and 50 µm or less.

6. The electronic device of claim 2, wherein the semiconductor die includes a gallium nitride layer and a silicon substrate and the silicon substrate extends along the side of the semiconductor die.

7. The electronic device of claim 2, further comprising a dielectric material in the cavity of the embedded die frame, wherein the metal layer extends along a portion of the dielectric material.

8. The electronic device of claim 1, wherein:
   the thermally conductive insulator layer includes an adhesive sublayer and a resin sublayer;
   the adhesive sublayer extends on the first side of the thermally conductive insulator layer and over the side of the semiconductor die;
   the resin sublayer extends between the second side of the thermally conductive insulator layer and the adhesive sublayer; and
   the metal plate extends on the resin sublayer.

9. The electronic device of claim 1, wherein:
   the metal plate has a first thickness;
   the thermally conductive insulator layer has a second thickness; and
   the first thickness is greater than the second thickness.

10. The electronic device of claim 1, wherein the first side of the thermally conductive insulator layer is directly on the side of the semiconductor die.

11. An electronic device, comprising:
    an embedded die frame having a cavity and a routing structure;
    a semiconductor die including a silicon substrate and a gallium nitride layer, the gallium nitride layer on the silicon substrate, the semiconductor die in the cavity, and the gallium nitride layer on the routing structure;
    a heat spreader having a thermally conductive insulator layer and a metal plate, the thermally conductive insulator layer having a first side that faces the embedded die frame and an opposite second side that faces away from the embedded die frame, a portion of the first side of the thermally conductive insulator layer extending over a side of the silicon substrate, and the metal plate on the second side of the thermally conductive insulator layer.

12. The electronic device of claim 11, further comprising a metal layer having a first side and a second side, a portion of the first side of the metal layer on the side of the silicon substrate, and a portion of the first side of the thermally conductive insulator layer on the second side of the metal layer.

13. The electronic device of claim 12, wherein the metal plate has a first thickness, the metal layer has a second thickness, and the first thickness is greater than the second thickness.

14. The electronic device of claim 11, wherein the first side of the thermally conductive insulator layer is directly on the side of the semiconductor die.

15. The electronic device of claim 11, wherein the metal plate has a first thickness, the metal layer has a second thickness, and the first thickness is greater than the second thickness.

16. The electronic device of claim 11, wherein the metal layer has a thickness of approximately 10 μm or more and 50 μm or less.

* * * * *